United States Patent
Jha

(10) Patent No.: US 9,853,600 B1
(45) Date of Patent: Dec. 26, 2017

(54) SYSTEM AND METHOD FOR ADAPTIVE POWER MODULATION FOR POWER AMPLIFIER

(71) Applicant: Raytheon Company, Waltham, MA (US)

(72) Inventor: Uma S. Jha, Tustin, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/194,051

(22) Filed: Jun. 27, 2016

(51) Int. Cl.
| H03F 1/02 | (2006.01) |
| H03F 1/32 | (2006.01) |
| H03F 3/20 | (2006.01) |
| H03F 3/189 | (2006.01) |

(52) U.S. Cl.
CPC ......... H03F 1/0216 (2013.01); H03F 1/3241 (2013.01); H03F 3/189 (2013.01); H03F 3/20 (2013.01); *H03F 2200/105* (2013.01); *H03F 2200/451* (2013.01)

(58) Field of Classification Search
CPC .................................................. H03F 1/0211
USPC .................................................. 330/127, 297
See application file for complete search history.

(56) References Cited

U.S. PATENT DOCUMENTS

| 6,407,634 | B1 | 6/2002 | Staudinger et al. |
| 7,620,377 | B2 * | 11/2009 | Dwyer ..................... H03C 5/00 375/295 |
| 8,509,714 | B2 | 8/2013 | Kim et al. |
| 8,810,314 | B2 | 8/2014 | Mulawski et al. |
| 9,219,445 | B2 | 12/2015 | Nobbe et al. |
| 9,385,662 | B2 * | 7/2016 | Wimpenny ........... H03F 1/0227 |
| 2004/0198271 | A1 | 10/2004 | Kang |
| 2006/0197652 | A1 | 9/2006 | Hild et al. |
| 2008/0278136 | A1 | 11/2008 | Murtojarvi |
| 2010/0295613 | A1 * | 11/2010 | Asbeck ................. H03F 1/0216 330/149 |
| 2014/0210441 | A1 | 7/2014 | Mao et al. |
| 2014/0266433 | A1 | 9/2014 | Nobbe |
| 2015/0035608 | A1 * | 2/2015 | Miyashita ............. H03F 1/0233 330/297 |
| 2016/0072457 | A1 | 3/2016 | Subrahmaniyan et al. |
| 2016/0099686 | A1 * | 4/2016 | Perreault ................ H03G 3/004 330/296 |

FOREIGN PATENT DOCUMENTS

EP 2432118 3/2012

OTHER PUBLICATIONS

Notification of Transmittal of the International Search Report and the Written Opinion of the International Searching Authority, or the Declaration dated May 17, 2017 in connection with International Patent Application No. PCT/US2017/017019.

* cited by examiner

*Primary Examiner* — Henry Choe

(57) ABSTRACT

A method includes determining one or more characteristics of a system that uses a power amplifier. The method also includes determining, based on the one or more determined characteristics, a switching speed and a supply voltage for the power amplifier. The method further includes modulating a power supply of the power amplifier according to the determined switching speed and supply voltage.

20 Claims, 5 Drawing Sheets

FIG. 6

| PARAMETERS | RANGE | POWER SUPPLY MODULATION ||
| --- | --- | --- | --- |
| | | SWITCHING RATE | VOLTAGE |
| PAPR | 0 - 30 dB | 0 Hz | 1 V |
| SIGNAL BW | 1 KHz - 50 MHz | 10 Hz | 1.5 V |
| SAMPLE SIZE | | 100 Hz | 2.0 V |
| SHORT TERM STATISTICS | 1 - 10 | 1 KHz | 2.5 V |
| LONG TERM STATISTICS | 10 - 100 | 0 | 0 |
| SWITCHER SPEED | 1 - 100 MHz | 0 | 0 |
| DC-TO-DC POWER SUPPLY | 0.1 - 50V | 0 | 0 |
| OPERATING ENVIRONMENT | -25 ~ 100 °C | 1 MHz | 5.0 V |
| FREQUENCY RANGE | 100 MHz - 60 MHz | 10 MHz | 10.0 V |
| TECHNOLOGY | Si, SoI, SiGe, GaN, GaAS | 50 MHz | 50 V |
| IN-BAND SPURS OUT OF BAND SPECTRUM GROWTH CONTAINMENT | 0.1 - 3 dB 30 - 100 dB | | |

SYSTEM AND METHOD FOR ADAPTIVE POWER MODULATION FOR POWER AMPLIFIER

TECHNICAL FIELD

This disclosure is directed in general to power amplifiers. More specifically, this disclosure relates to a system and method for adaptive power modulation for a power amplifier in various applications, such as communication, electronic warfare, and radar applications.

BACKGROUND

The power amplifier plays a vital role in many radar, electronic warfare, and communication systems. Performance of these systems is often largely affected by the efficiency of these power amplifiers. Unfortunately most power amplifiers operate in the linear region where their efficiency is pretty low (e.g., approximately 10~30%). At such a poor efficiency, most power is wasted and converted into heat, which requires the corresponding system to be cooled for reliable operation. Power amplifiers are most efficient when they are operated at peak output power just below the compression point. For a typical RF/communication system, it is possible to achieve up to approximately 50% efficiency when a device is operating at or around peak output power. However, much of the efficiency is lost when output power is backed off from the peak power due to the higher peak-to-average power ratio (PAPR) waveform of modern RF/communication systems.

SUMMARY

This disclosure provides a system and method for adaptive power modulation for a power amplifier.

In a first embodiment, a method includes determining one or more characteristics of a system that uses a power amplifier. The method also includes determining, based on the one or more determined characteristics, a switching speed and a supply voltage for the power amplifier. The method further includes modulating a power supply of the power amplifier according to the determined switching speed and supply voltage.

In a second embodiment, a system includes a power amplifier having a power supply, and a power supply modulator. The power supply modulator is configured to determine one or more characteristics of the system. The power supply modulator is also configured to determine, based on the one or more determined characteristics, a switching speed and a supply voltage for the power amplifier. The power supply modulator is further configured to modulate the power supply of the power amplifier according to the determined switching speed and supply voltage.

In a third embodiment, a non-transitory computer readable medium containing instructions that, when executed by at least one processing device, cause the at least one processing device to determine one or more characteristics of a system that uses a power amplifier; determine, based on the one or more determined characteristics, a switching speed and a supply voltage for the power amplifier; and modulate a power supply of the power amplifier according to the determined switching speed and supply voltage.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIG. 6 illustrates an example look up table for use with the system of FIG. 5 according to this disclosure;

DETAILED DESCRIPTION

FIGS. 1 through 8, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity, and not meant to imply that the feature or component cannot be employed in the embodiments described in connection with that figure.

Figure 1:
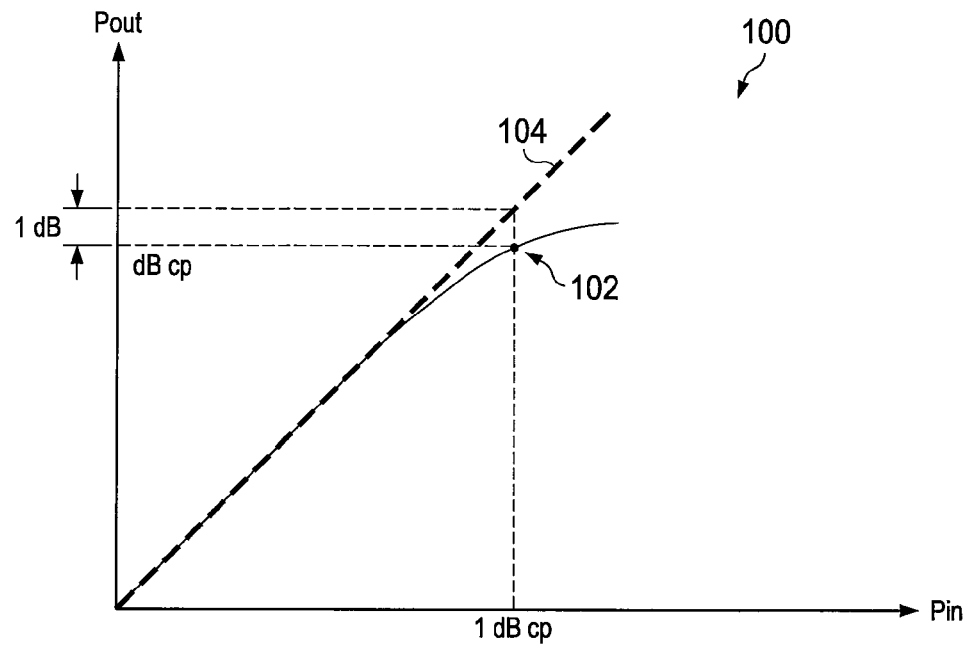
FIG. 1 illustrates a chart showing a power curve for a typical power amplifier.

FIG. 1 illustrates a chart 100 showing a power curve for a typical power amplifier (PA). The point on the chart 100 indicated at 102 is the compression point for this PA. As known in the art, the compression point is the point at which the actual output power of the PA $P_{out}$ is 1 dB less than a theoretical $P_{out}$ if the power curve had remained linear as indicated by the dotted line 104. Power amplifiers are most efficient when they are operated at peak output power just below the compression point 102. For a typical RF/communication system, it is possible to achieve up to approximately 50% efficiency when a device is operating at or around peak output power. However, much of the efficiency is lost when output power is backed off from the peak power due to the higher peak-to-average power ratio (PAPR) waveform of modern RF/communication systems. For higher PAPR waveforms, a power amplifier operates at an average output power well below its optimum value.

In some PAs, the drain supply voltage Vdd may be adjusted to allow for necessary load line swing, instead of operating the PA at the optimum peak-power bias point. A programmable load line provides support to signals without saturating or cutting off. This allows the PA to operate at a smaller Vdd and therefore consume less DC power.

Figure 2:
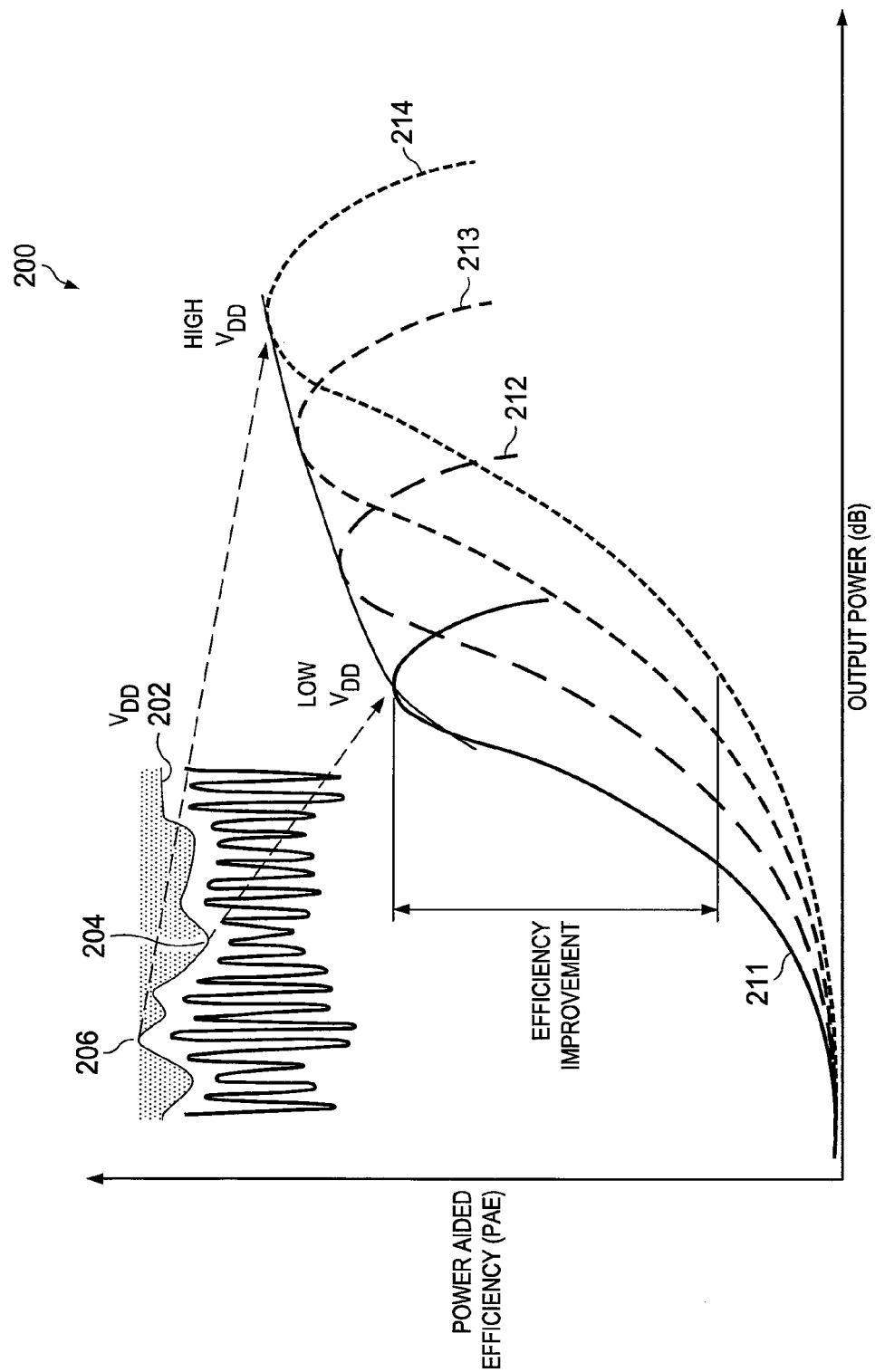
FIG. 2 illustrates a chart showing power aided efficiency (PAE) of a power amplifier as a function of drain supply voltage.

FIG. 2 illustrates a chart 200 showing power aided efficiency (PAE; also referred to as power added efficiency) of a power amplifier as a function of drain supply voltage. The small plot in the upper left corner shows the modulated power supply waveform 202 to accommodate the transmitted signal over time. As can be seen in the plot, the power supply waveform 202 varies over time between a low point 204 and a high point 206. Each point in the waveform 202 corresponds to a drain supply voltage Vdd. Each drain supply voltage Vdd is associated with a corresponding PAE curve, such as the representative PAE curves 211-214 where the PAE is plotted for various fixed drain supply voltages Vdd. During linear operation, for a given fixed supply, the PAE rises with a rise of the output power until the output eventually saturates (e.g. close to saturation) and the PAE reaches a maximum practical level. This maximum practical level is a function of the fixed drain supply voltage Vdd. Raising the fixed drain supply voltage Vdd yields a higher maximum value for the PAE as depicted by the rise in the curves 211-214. In general, peak efficiency can also vary based on waveform characteristics. Vdd modulation allows for the efficiency to follow the peaks of the modulated drain voltage.

Figure 3:
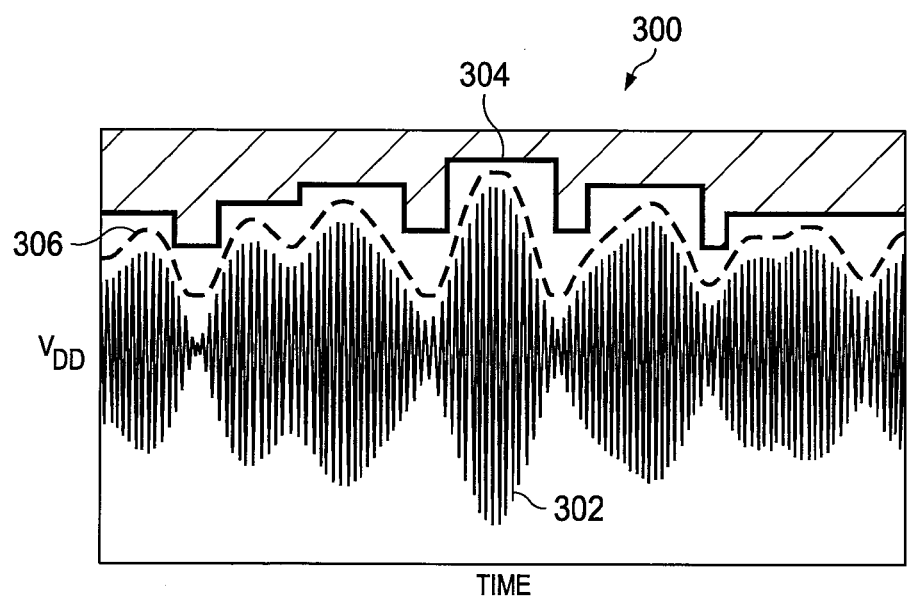
FIG. 3 illustrates a chart showing different power tracking techniques for reducing unnecessary power consumption and improving PAE in a power amplifier.

FIG. 3 illustrates a chart 300 showing different power tracking techniques for reducing unnecessary power consumption and improving PAE in a power amplifier. In the chart 300, the region 302 represents the signal waveform, which varies over time.

The plot line 304 shows modulation of the drain supply voltage Vdd using an average power tracking (APT) technique. APT is a widely-implemented approach to reduce unnecessary power consumption in RF PAs. A DC-to-DC converter connected to the PA supply voltage dynamically changes the Vdd based on the PA average output power. When the PA output power is below maximum, the PA supply voltage is reduced and improves PA efficiency. Adjustments in Vdd occur whenever the average output power changes, as indicated by the changes in the plot line 304. APT modulates Vdd using relatively long term statistics.

In contrast, another technique referred to as envelope tracking (ET) uses relatively short term statistics to maximize PAE. The plot line 306 shows modulation of the Vdd using an ET technique. ET uses a dynamic Vdd, which tracks the RF modulation amplitude (the instantaneous output power level) instead of the average output power level. An envelope-tracking power supply (ETPS) is used as a dynamic power supply for the PA, adjusting the Vdd more frequently and optimizing PAE for smaller increments of time. Thus, ET improves efficiency for high-PAPR modulation at high average output power.

Both APT and ET techniques have disadvantages. In particular, ET is complex to implement, and is associated with various switcher anomalies, interfrequency modulation (IM) products, and amplitude modulation (AM) to phase modulation (PM) issues. Similarly, APT, while easy to implement, does not fully take advantage of the transmit waveform characteristics and switcher offerings, and thus marginalizes the improvements in PAE.

Figure 4:
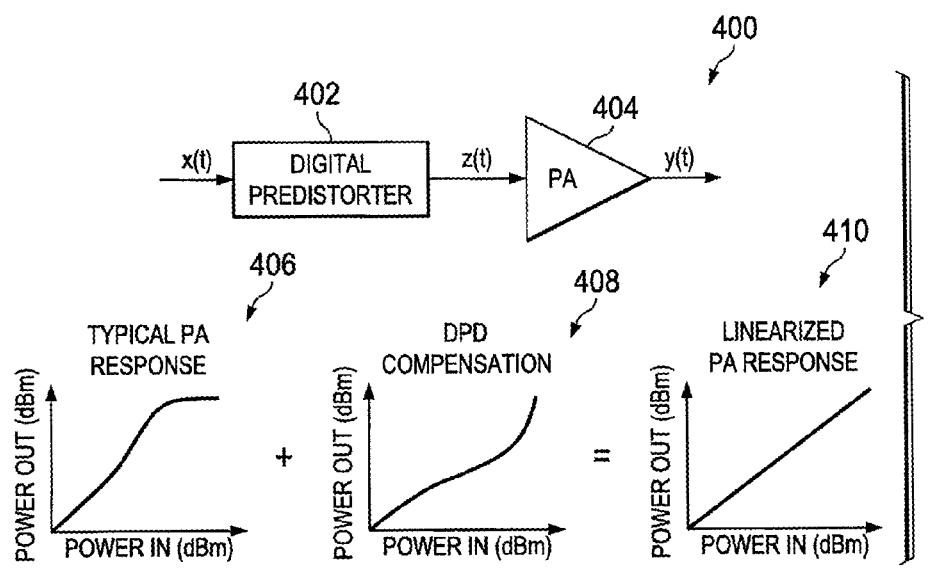
FIG. 4 illustrates a digital predistortion (DPD) technique for improving PAE in a power amplifier.

FIG. 4 illustrates a digital predistortion (DPD) technique for improving PAE in a power amplifier. In a system 400 that uses a power amplifier 404, a digital predistorter 402 compensates for signal distortions inherent to the PA 404. For example, the plot 406 shows a response power curve for a typical PA, such as the PA 404. The digital predistorter 402 anticipates the power output for the PA 404 and provides an compensation signal in advance (i.e., digital predistortion), as indicated by the plot 408. When the predistorted signal is amplified at the PA 404, the resulting PA response is substantially linearized, as indicated by the plot 410. In other words, two non-linear components are combined to generate a substantially linear output. While results of DPD can be good, DPD techniques requires specific detailed knowledge of the PA 404 to accurately model and compensate for its behavior. Such knowledge may not be available for some PAs. In addition, the DPD techniques represent a static compensation solution. However, many PA environments are highly dynamic, and the voltage, temperature, and operating conditions of the PA are subject to large variations during use, so it can be very difficult to implement DPD successfully in such a dynamic environment.

As discussed above, current techniques for PA power supply modulation, such as described with respect to FIGS. 3 and 4, have a number of disadvantages, including poor performance, or high cost and size penalties. Additionally, these techniques do not provide any programmability or adaptability.

To address these or other issues, embodiments of this disclosure provide adaptive power modulation techniques that improve the PAE of a PA by allowing the PA to operate at its optimum value based on a number of signal characteristics, which are known a priori. For example, the disclosed techniques take advantage of a priori knowledge of signal statistics, latency, switching, and signal bandwidth to formulate the optimal switching rate. Using the disclosed techniques, the power supply voltage is varied accordingly to obtain optimal efficiency for a given output power. The disclosed techniques allow the PA to have a broad range of operating scenarios based on system requirements and size, weight, and power (SWaP) constraints and offers alternative schemes to improve the power efficiency without adversely affecting other system performance metrics. By optimizing the efficiency of the PA, the disclosed techniques minimize system cooling and overall footprint requirements and improve system reliability. This helps to enhance system performance including mission effectiveness and assurance.

It will be understood that embodiments of this disclosure may include any one, more than one, or all of the features described here. In addition, embodiments of this disclosure may additionally or alternatively include other features not listed here. While the disclosed embodiments are described with respect to PAs in communication, radar and electronic warfare applications, these embodiments are also applicable in any other suitable systems or applications.

Figure 5:
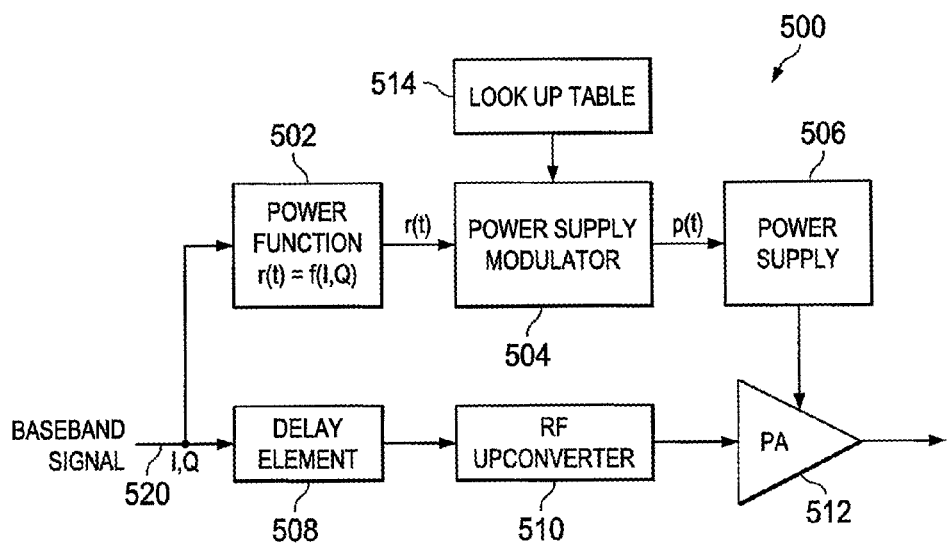
FIG. 5 illustrates a system that uses adaptive power modulation according to this disclosure.

FIG. 5 illustrates a system 500 that uses adaptive power modulation according to this disclosure. The embodiment of the system 500 shown in FIG. 5 is for illustration only. Other embodiments of the system 500 could be used without departing from the scope of this disclosure.

As shown in FIG. 5, the system 500 includes a power function block 502, a power supply modulator 504, a power supply 506, a delay element 508, an RF upconverter 510, and a power amplifier (PA) 512.

The system 500 receives a baseband signal 520 that is to be amplified by the PA 512 before being transmitted. The baseband signal 520 is divided into in phase (I) and quadrature (Q) components, and the I and Q components are output to the power function block 502.

The power function block 502 receives the I and Q components of the baseband signal 520 and determines a power setting function r(t) for the PA 512 based on the I and Q components. In some embodiments, the function r(t)=f(I, Q) can be defined very generically to support alternative operating conditions. The power setting function r(t) is then output to the power supply modulator 504.

The power supply modulator 504 receives the power setting function r(t) output from the power function block 502. The power supply modulator 504 generates a power modulation function p(t) based on the power setting function r(t) and various known components of the system 500 using adaptive power modulation as described in greater detail below. The power supply modulator 504 modulates the power supply 506 according to the power modulation function p(t). The modulated power supply 506 then supplies power to the PA 512 according to the function p(t). In some embodiments, the power supply 506 is a DC to DC power supply, although any other suitable power supply could be used.

The delay element 508 applies a delay to the baseband signal 520 in order to account for the inherent latency resulting from processing times in the power function block 502 and the power supply modulator 504. An appropriate delay at the delay element 508 aligns the baseband signal 520 with a corresponding power setting of the PA 512.

The RF upconverter 510 receives the baseband signal 520 from the delay element 508, upconverts the baseband signal 520, and outputs the upconverted signal to the PA 512, where it is amplified before transmission.

As discussed above, the power supply modulator 504 modulates the power supply 506 according to the power modulation function p(t). The power modulation function p(t) allows for dynamic frequency planning to avoid in-band harmonics and out-of-band spectral regrowth for wide band applications. In particular, the power supply modulator 504 maps the instantaneous baseband signal amplitude to the supply voltage and switching rate, which are determined using a look up table (LUT) 514. The determined supply voltage and switching rate, in turn, optimize the performance of the PA 512 by dynamically adjusting the behavior of the PA 512 according to the current inputs.

The power supply modulator 504 takes into account a number of platform SWaP requirements and constraints, which are known a priori, to formulate the power modulation function p(t), which determines the switching rate and power supply voltage for the PA 512. These requirements and constraints can include carrier frequency, PAPR, bandwidth of the signal in space (SiS), short-term and long-term waveform characteristics, power requirements, cooling requirements, frequency planning, in-band spurs and out-of-band ACLR requirements, and switcher characteristics. In general, the power modulation function p(t) is embodied in the LUT 514 and can be programmed to accommodate many design choices based on one, some, or all of the characteristics listed above.

FIG. 6 illustrates an example of the LUT 514 according to this disclosure. The embodiment of the LUT 514 shown in FIG. 6 is for illustration only. Other embodiments of the LUT 514 can be used without departing from the scope of this disclosure.

As shown in FIG. 6, the LUT 514 is a multidimensional data structure having multiple input parameters 602. The input parameters 602 correspond to various signal, environmental, and power parameters associated with the system 500 in which the PA 512 operates. Multiple input parameters 602 can be considered together to control the power supply modulation. Each input parameter 602 has a corresponding range of values 604. While the values 604 are expressed as a range in FIG. 6, the LUT 514 can actually include discrete records corresponding to different values within each range of values 604. For example, instead of the LUT 514 having a single record for a PAPR range of 0-30 dB, the LUT 514 can have different records corresponding to PAPR values of, e.g., 0 dB, 2 dB, 4 dB, and so on, up to 30 dB.

In addition to the input parameters 602, the LUT 514 includes modulation outputs 606-608. These include the voltage switching rate 606 and the supply voltage 608. The LUT 514 is arranged such that, for a given set of input parameters 602, the power supply modulator 504 can determine the optimal voltage switching rate 606 and the supply voltage 608 for the PA 512. The parameters 602 and the corresponding values 604-608 in the LUT 514 can be determined empirically and can be configured for a wide range of operating conditions. Thus, use of the LUT 514 provides a wide operating range for the system 500 to achieve power aided efficiency based on SWaP constraints and provide adequate operating headroom or buffer for possible variations in the baseband signal 520 from what is expected.

Using the power supply modulator 504 and LUT 514 for adaptive power modulation is superior to current power tracking techniques. For example, many current power tracking techniques are only suitable for low signal bandwidth. Because the switching rate is proportional to signal bandwidth (e.g., in some systems, the switching rate is twice the bandwidth, so 10 MHz bandwidth requires a 20 MHz switching rate), a higher bandwidth signal requires a higher switching rate. Most current switches do not support a switching rate higher than about 10 MHz. This is not adequate to support higher bandwidth signals, such as those with a bandwidth greater than 10 MHz. Additionally, the programmability of such switches is limited and does not adequately handle in-band spurs and out-of-band adjacent channel leakage ratio (ACLR) management. Moreover, many switches support only lower voltage applications (e.g., 3-5 V, which is a common voltage range in mobile devices, for example). In contrast, the adaptive power modulation performed in the system 500 is suitable for implementations with switcher speeds of 100 MHz or higher and voltages of 100 V or higher.

Although FIG. 6 illustrates one example of a LUT 514, various changes may be made to FIG. 6. For example, while shown as having certain rows, columns, and data values, these are provided for illustration purpose only; the values shown can vary significantly in real implementations and can be arranged in different formats according to particular needs. As a particular example, the LUT 514 may additionally or alternatively include values associated with operating and environmental conditions such as humidity, pressure, and the like.

Although FIG. 5 illustrates one example of system 500 that uses adaptive power modulation, various changes may be made to FIG. 5. For example, while the power function block 502 and the power supply modulator 504 are shown as separate components, this is merely for clarity of illustration. In some embodiments, these components could be combined into one block. In general, the makeup and arrangement of the system 500 are for illustration only. Components could be added, omitted, combined, or placed in any other configuration according to particular needs.

Figure 7:
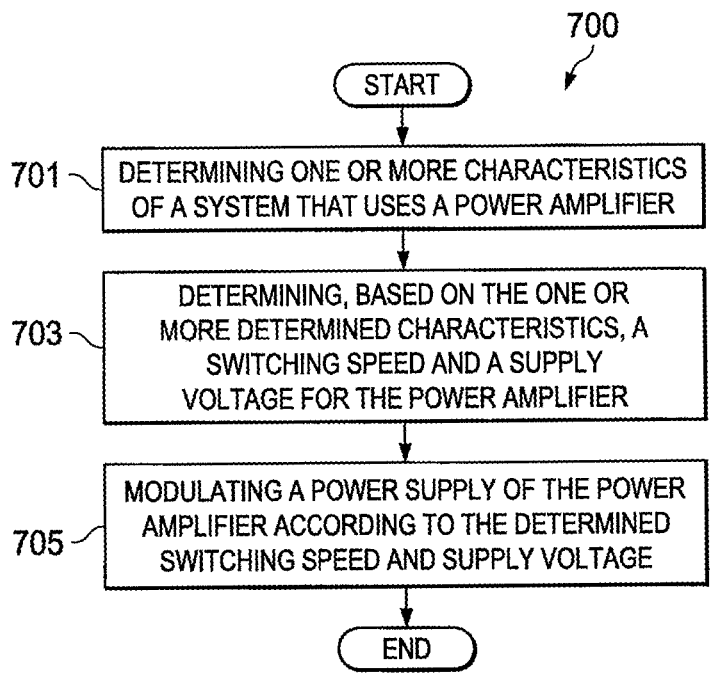
FIG. 7 illustrates an example method for adaptive power modulation according to this disclosure.

FIG. 7 illustrates an example method 700 for adaptive power modulation according to this disclosure. The method 700 may be performed using the system 500 of FIG. 5. However, the method 700 could be used with any other suitable system.

At step 701, one or more characteristics of a system that uses a power amplifier are determined. This may include, for example, the power supply modulator 504 determining a characteristic related to the baseband signal 520 or determining a size, weight, and power (SWaP) characteristic of the system 500. Specifically, this may include the power supply modulator 504 determining one or more of carrier frequency, PAPR, bandwidth of a signal in space (SiS), short-term and long-term baseband signal waveform characteristics, power requirements, cooling requirements, frequency planning, in-band spurs and out-of-band ACLR requirements, or voltage switcher characteristics.

At step 703, a switching speed and a supply voltage for the power amplifier are determined based on the one or more characteristics determined at step 701. This may include, for example, the power supply modulator 504 selecting the switching speed and the supply voltage from the look up table 514.

At step 705, a power supply of the power amplifier is modulated according to the determined switching speed and supply voltage. This may include, for example, the power supply modulator 504 dynamically modulating the power supply according to a changing amplitude of the baseband signal.

Although FIG. 7 illustrates one example of a method 700 for adaptive power modulation, various changes may be made to FIG. 7. For example, while shown as a series of steps, various steps shown in FIG. 7 could overlap, occur in parallel, occur in a different order, or occur multiple times. Moreover, some steps could be combined or removed and additional steps could be added according to particular needs.

Figure 8:
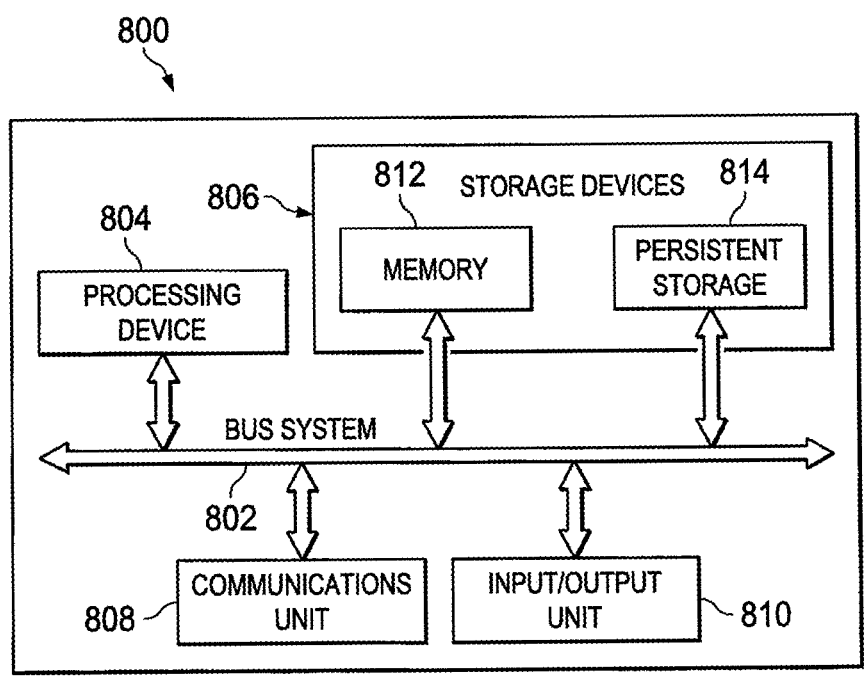
FIG. 8 illustrates an example device for performing adaptive power modulation according to this disclosure.

FIG. 8 illustrates an example device 800 for performing adaptive power modulation according to this disclosure. The device 800 could, for example, represent a computing device or control device in the system 500 of FIG. 5, such as the power supply modulator 504. The device 800 could represent any other suitable device for performing adaptive power modulation.

As shown in FIG. 8, the device 800 can include a bus system 802, which supports communication between at least one processing device 804, at least one storage device 806, at least one communications unit 808, and at least one input/output (I/O) unit 810. The processing device 804 executes instructions that may be loaded into a memory 812. The processing device 804 may include any suitable number(s) and type(s) of processors or other devices in any suitable arrangement. Example types of processing devices 804 include microprocessors, microcontrollers, digital signal processors, field programmable gate arrays, application specific integrated circuits, and discrete circuitry.

The memory 812 and a persistent storage 814 are examples of storage devices 806, which represent any structure(s) capable of storing and facilitating retrieval of information (such as data, program code, and/or other suitable information on a temporary or permanent basis). The memory 812 may represent a random access memory or any other suitable volatile or non-volatile storage device(s). The persistent storage 814 may contain one or more components or devices supporting longer-term storage of data, such as a ready only memory, hard drive, Flash memory, or optical disc. In accordance with this disclosure, the memory 812 and the persistent storage 814 may be configured to store instructions associated with facilitating dynamic remapping of absolute addresses during a software migration.

The communications unit 808 supports communications with other systems, devices, or networks, such as the system 500. For example, the communications unit 808 could include a network interface that facilitates communications over at least one Ethernet network. The communications unit 808 could also include a wireless transceiver facilitating communications over at least one wireless network. The communications unit 808 may support communications through any suitable physical or wireless communication link(s).

The I/O unit 810 allows for input and output of data. For example, the I/O unit 810 may provide a connection for user input through a keyboard, mouse, keypad, touchscreen, or other suitable input device. The I/O unit 810 may also send output to a display, printer, or other suitable output device.

Although FIG. 8 illustrates one example of a device 800 for performing adaptive power modulation, various changes may be made to FIG. 8. For example, various components in FIG. 8 could be combined, further subdivided, or omitted and additional components could be added according to particular needs. Also, computing devices can come in a wide variety of configurations, and FIG. 8 does not limit this disclosure to any particular configuration of device.

The disclosed embodiments provide adaptive power modulation techniques that mitigate many SWaP constraints and issues and provide PAE improvements that allow for better and improved system performance for many applications in communication, radar and electronic warfare domains. The disclosed embodiments leverage commercial off the shelf (COTS) components and matured technologies. These techniques allow for future enhancements as new innovations and technology bring faster switching DC-to-DC converters to support high bandwidth applications (e.g., certain military applications).

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. §112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. §112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   determining one or more characteristics of a system that uses a power amplifier;
   determining, based on the one or more determined characteristics, a switching speed and a supply voltage for the power amplifier; and
   modulating a power supply of the power amplifier according to the determined switching speed and supply voltage.

2. The method of claim 1, wherein determining the switching speed and the supply voltage comprises selecting the switching speed and the supply voltage from a look-up table based on the one or more determined characteristics.

3. The method of claim 1, wherein:
   the power amplifier is configured to amplify a baseband signal, and
   a first one of the one or more characteristics is related to the baseband signal.

4. The method of claim 3, wherein a second one of the one or more characteristics includes a size, weight, and power (SWaP) characteristic of the system.

5. The method of claim 3, wherein modulating the power supply comprises dynamically modulating the power supply according to a changing amplitude of the baseband signal.

6. The method of claim 3, wherein the baseband signal is divided into in-phase and quadrature components before amplification by the power amplifier.

7. The method of claim 1, wherein the one or more characteristics include at least one of: carrier frequency, peak-to-average power ratio (PAPR), bandwidth of a signal in space (SiS), short-term and long-term baseband signal waveform characteristics, power requirements, cooling requirements, frequency planning, in-band spurs and out-of-band adjacent channel leakage ratio (ACLR) requirements, or voltage switcher characteristics.

8. A system comprising:
   a power amplifier comprising a power supply; and
   a power supply modulator configured to:
      determine one or more characteristics of the system;
      determine, based on the one or more determined characteristics, a switching speed and a supply voltage for the power amplifier; and
      modulate the power supply of the power amplifier according to the determined switching speed and supply voltage.

9. The system of claim 8, wherein the power supply modulator is configured to determine the switching speed and the supply voltage by selecting the switching speed and the supply voltage from a look-up table based on the one or more determined characteristics.

10. The system of claim 8, wherein:
    the power amplifier is configured to amplify a baseband signal, and
    a first one of the one or more characteristics is related to the baseband signal.

11. The system of claim 10, wherein a second one of the one or more characteristics includes a size, weight, and power (SWaP) characteristic of the system.

12. The system of claim 10, wherein the power supply modulator is configured to modulate the power supply by dynamically modulating the power supply according to a changing amplitude of the baseband signal.

13. The system of claim 10, wherein the baseband signal is divided into in-phase and quadrature components before amplification by the power amplifier.

14. The system of claim 8, wherein the system is at least one of a communication, radar or electronic warfare system.

15. The system of claim 8, wherein the one or more characteristics include at least one of: carrier frequency, peak-to-average power ratio (PAPR), bandwidth of a signal in space (SiS), short-term and long-term baseband signal waveform characteristics, power requirements, cooling requirements, frequency planning, in-band spurs and out-of-band adjacent channel leakage ratio (ACLR) requirements, or voltage switcher characteristics.

16. A non-transitory computer readable medium containing instructions that, when executed by at least one processing device, cause the at least one processing device to:
    determine one or more characteristics of a system that uses a power amplifier;
    determine, based on the one or more determined characteristics, a switching speed and a supply voltage for the power amplifier; and
    modulate a power supply of the power amplifier according to the determined switching speed and supply voltage.

17. The non-transitory computer readable medium of claim 16, wherein the instructions that cause the at least one processing device to determine the switching speed and the supply voltage comprise:
    instructions that cause the at least one processing device to select the switching speed and the supply voltage from a look-up table based on the one or more determined characteristics.

18. The non-transitory computer readable medium of claim 16, wherein:
    the power amplifier is configured to amplify a baseband signal, and
    a first one of the one or more characteristics is related to the baseband signal.

19. The non-transitory computer readable medium of claim 18, wherein a second one of the one or more characteristics includes a size, weight, and power (SWaP) characteristic of the system.

20. The non-transitory computer readable medium of claim 18, wherein the instructions that cause the at least one processing device to modulate the power supply comprise:
    instructions that cause the at least one processing device to dynamically modulate the power supply according to a changing amplitude of the baseband signal.

* * * * *